(12) United States Patent
Hobelsberger

(10) Patent No.: US 7,212,010 B2
(45) Date of Patent: May 1, 2007

(54) METHOD AND DEVICE FOR DETECTING A CONTACT POINT ON A SHAFT OF A ROTATING MACHINE

(75) Inventor: Max Hobelsberger, Wuerenlingen (CH)

(73) Assignee: Alstom Technology Ltd., Baden (CH)

( * ) Notice: Subject to any disclaimer, the term of this patent is extended or adjusted under 35 U.S.C. 154(b) by 0 days.

(21) Appl. No.: 11/202,274

(22) Filed: Aug. 11, 2005

(65) Prior Publication Data

US 2006/0043977 A1 Mar. 2, 2006

(30) Foreign Application Priority Data

Aug. 12, 2004 (CH) .................................... 1332/04

(51) Int. Cl.
*G01R 31/06* (2006.01)
(52) U.S. Cl. ........................ 324/545; 324/544; 324/772
(58) Field of Classification Search ............... 324/545, 324/544, 772
See application file for complete search history.

(56) References Cited

U.S. PATENT DOCUMENTS

| | | | |
|---|---|---|---|
| 3,831,160 A | 8/1974 | Cronin et al. ............... | 340/256 |
| 4,831,295 A | 5/1989 | Posedel ........................ | 310/72 |
| 6,460,013 B1 | 10/2002 | Nippes ........................ | 702/183 |
| 6,798,112 B1 * | 9/2004 | Daley .......................... | 310/261 |

FOREIGN PATENT DOCUMENTS

| | | |
|---|---|---|
| CA | 2 498 060 | 3/2004 |
| CA | 2 498 060 A1 | 3/2004 |
| CA | 2 498 105 | 3/2004 |
| CA | 2 498 105 A1 | 3/2004 |
| DE | 1 217 493 | 5/1966 |
| EP | 0 271 678 | 6/1988 |
| EP | 0 503 846 | 9/1992 |
| WO | WO 2004/025316 | 3/2004 |
| WO | WO 2004/025811 | 3/2004 |

OTHER PUBLICATIONS

Ong et al., "Shaft Currrent in AC Induction Machine—An Online Monitoring System and Prediction Rules", IEEE Transaction on Industry Applications, vol. 37, No. 4, Jul./Aug. 2001.*
European Search Report for EP 05 10 7160 (8 pages) and brief translation thereof (1 page).

* cited by examiner

*Primary Examiner*—Walter Benson
(74) *Attorney, Agent, or Firm*—Darby & Darby

(57) ABSTRACT

A method and a device for detecting a touching point (i.e. contact point) on a machine having a rotating shaft, in which the touching point (i.e. contact point) on the shaft is determined during operation. This is performed by measuring the grounding state of the shaft by measuring a characteristic (such as a current) of electricity flowing to ground via one or more ground connections provided on the shaft.

15 Claims, 2 Drawing Sheets

METHOD AND DEVICE FOR DETECTING A CONTACT POINT ON A SHAFT OF A ROTATING MACHINE

Priority is claimed to Swiss application CH 01332/04, filed Aug. 12, 2004 the entire disclosure of which is hereby incorporated by reference herein.

The present invention relates to a method and a device for monitoring rotating machines. In particular, it relates to a method for detecting touching points or contact points on machines having rotating shafts, such as generators, turbines, and motors, during operation.

In particular, the invention relates to the detection of shaft friction, i.e. the occurrence of touching points or contact points between the drive shaft and the housing. A particular intended use is monitoring the bearing insulation in generators.

BACKGROUND

Electrical machines, in particular large electrical machines such as those used in power stations, should be monitored continuously in order to ensure friction-free operation and/or analyzed from time to time in order to recognize faults in time and to avoid uncontrolled failures.

EP 0 271 678 A1 proposes, for example, a device with which statements can be made on the functional reliability and functional safety of the shaft grounding or the insulation of the shaft. The device proposed therein, which is actually envisaged for reducing shaft voltages, allows statements to be made on the entire grounding conditions of the electrical machine.

If the rotating metal shaft of a machine comes into contact with or touches the metal of the housing parts surrounding it, wear occurs. With generators, considerable electrical currents can also flow via the contact points and lead to instances of overheating, erosion or even melting processes. It is correspondingly desirable to detect such instances of the metal parts coming into contact with each other during operation and to localize the touching points. In this document, the terms "touching points" and "contact points" are used interchangeably.

It is known to provide double insulation for the bearings of machines, for example for the purpose of detecting touching points, and to arrange a conductive layer between the two insulating layers. Monitoring is then carried out to ascertain whether this conductive intermediate layer has a resistive conductive connection to the shaft or to ground. If this is the case, one of the insulating layers is defective. One disadvantage of this method is the fact that the insulating layers in the bearing are only tested selectively, but not the shaft insulation per se, i.e. the insulation state of the entire shaft cannot be determined. It is therefore, for example, not possible to establish whether the shaft is in direct contact with the housing. One disadvantage of this method is, inter alia, that only the insulating layers in the bearing are tested, but not the shaft insulation per se. It is not possible to establish whether the shaft is in contact with, for example, the housing.

Methods also exist in which currents through the shaft are measured by means of uniform-field coils. Here too, contact points between the shaft and the housing or ground are not detected directly, but only the indirect consequences of these contacts.

EP 0 503 846 A2 describes a method and a device for detecting faults in the insulation between a shaft of a generator and the bearings or seals which guide said bearings. For measurement purposes, a transformer is placed around the stationary shaft and is driven with alternating current. Then, a voltage measuring device, which is grounded on one side and is connected to the shaft on the other side at a point at which a fault is suspected to be, is used to measure the voltage. Such methods allow for effective measurement of faults in the rest state, but the touching points or contact points occurring exclusively during operation cannot be found in this way.

SUMMARY OF THE INVENTION

An object of the present invention is to provide an improved method for detecting touching points or contact points on machines having rotating shafts, and a device for carrying out such a method. Of particular concern here is a method in which touching points or contact points are determined on the rotating shaft, i.e. during operation of the machine.

According to the present invention the grounding state of the shaft is measured, namely by determining an characteristic of an electrical flow to ground via at least one ground connection provided on the shaft, such as by determining all currents flowing to ground. The shaft of machines is normally grounded deliberately for safety reasons, for example a generator is often grounded at both ends by means of corresponding contact devices. In other words, the currents flowing out via these grounding devices may be measured. Conclusions are drawn on the state of insulation of the shaft on the basis of electrical flow to ground which occur on the grounding devices.

In accordance with a first preferred embodiment of the present invention, the grounding state of the shaft is thus determined by means of at least one grounding module which is electrically connected to the shaft, by the voltage to ground being measured via a grounding resistor. In this case, in order to simplify the analysis, the procedure is preferably to evaluate currents which flow from the shaft to ground as being positive.

In a particularly advantageous manner, the method in accordance with a further preferred embodiment can be carried out if at least from time to time, i.e. for example intermittently, a quantitatively determined test current is injected into the shaft for the purpose of detecting the insulation behavior. The injection of a test current into the shaft makes it possible, in particular, to evaluate the insulation behavior quantitatively since it is essentially possible to test what component of the test current flows out via the grounding devices (this component is measured) and what component correspondingly flows out via unintentional contacts. The test current is preferably a current having a known direct-current component in the range from 10 to 100 mA, in particular having a direct-current component in the range from 20 to 40 mA.

In this case, the test current is preferably injected into the shaft via a ground connection, in particular via a grounding brush forming contact with the shaft or a corresponding sliding contact. It is possible for a separate contact device to be provided for injecting the test current, but the contact capability already provided by means of the grounding brush simplifies the method considerably.

The present method is used, for example, in generators. In the case of generators, grounding devices are normally already provided; these so-called grounding modules are in this case typically arranged both on the turbine side and on the other side of the generator. The method can be implemented particularly easily if, in accordance with a further preferred embodiment, the test current is applied to the shaft at least indirectly via one or else two of these grounding modules. In this case, the test current may either be injected into the grounding module or else it is possible for the test current to be injected via the grounding brush connected to the grounding module. The ground connections provided may be at least one grounding module which is in contact with the shaft and grounded via at least one grounding brush.

A quantitative evaluation, in particular in the case of an intermittent injection of test current, can be achieved in accordance with another embodiment by the detection of touching points or contact points taking place by means of a comparison of the value of the test current with the difference between the currents flowing to ground via ground connections provided on the shaft without the test current being applied (total ground current without test current) and the currents flowing to ground via ground connections provided on the shaft with the test current being applied (total ground current with test current). It is thus possible for the conductivity of the touching points or contact points to be determined directly from the comparison of the value of the test current with the difference.

In accordance with another preferred embodiment, of the currents which flow to ground via ground connections provided on the shaft, only the DC component is evaluated in order to average out AC components typically present on the shaft. A further improvement of the evaluation can be achieved by the currents which flow to ground via ground connections provided on the shaft being averaged over time and/or filtered. When the shaft is rotating in the range from 50 to 60 Hz, averaging over 5 s, preferably over 10 s, has proven to be sufficient.

The present invention furthermore relates to a device for carrying out a method, as is described above. The device is particularly characterized by the fact that at least one grounding module is provided by at least one grounding brush forming contact with the shaft (or another contact point, for example a sliding contact), the at least one grounding module having at least one grounding resistor. A unit is also arranged which has, at least indirectly via the grounding module, a contact for injecting a defined test current into the shaft and taps off or measures the voltage applied across the at least one grounding resistor or receives the corresponding measured values transmitted by the grounding module.

In accordance with one preferred embodiment, the unit has means for measuring and/or evaluating the touching points or contact points on the basis of the quantitative value of the test current and of the ground currents flowing out via the grounding resistors. This unit, which is in the form of a measurement and evaluation module, is optionally part of at least one of the grounding modules.

BRIEF DESCRIPTION OF THE DRAWINGS

The invention will be explained in more detail below with reference to exemplary embodiments in conjunction with the drawings, in which.

DETAILED DESCRIPTION

Figure 1:
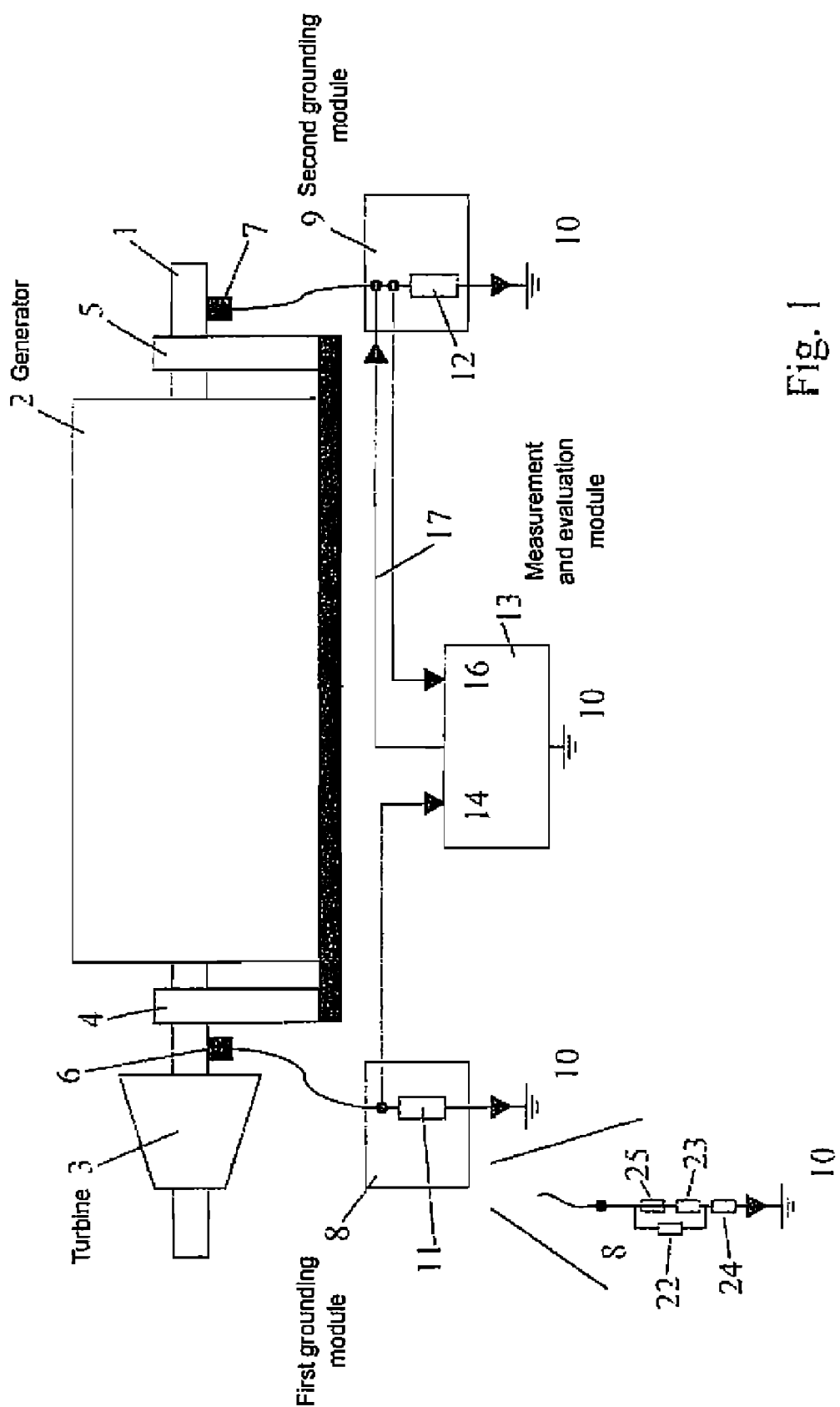
FIG. 1 shows a schematic illustration of a rotating machine having grounding and measuring devices.

FIG. 1 shows a schematic design, in which a turbine 3 and a generator 2 are arranged on a shaft 1. The shaft is mounted via two bearings 4 and 5. Further bearing points, for example behind the turbine, are not illustrated. The shaft of a generator 2 is normally grounded; this takes place via so-called grounding modules. In one specific case, two such grounding modules 8 and 9 are provided.

A first grounding module 8 is arranged on the turbine side, and contact is made between said first grounding module 8 and the shaft 1 via a grounding brush 6. The grounding module 8 and the grounding brush 6 form a first ground connection.

A second grounding module 9 is arranged on the other side of the generator and for its part has a grounding brush 7, by means of which the grounding module 9 is electrically connected to the shaft 1. The grounding module 9 and the grounding brush 7 form a second ground connection.

The two grounding modules 8 and 9 are connected to ground 10. Instead of the grounding brushes 6, 7, sliding contacts or other means for making contact with the shaft may also be used.

Although this is not necessary for the present invention, the grounding modules 8 and 9 may in this case be much more complex components. For example, the grounding module 8 arranged on the drive side may be a so-called DE module, as is described, inter alia, in WO 2004/025316 A1. Such a DE module (cf. inlay in FIG. 1) has a high-value resistor 22 ($R_{DE,1}$, 10Ω) for the contact device, in this case for the grounding brush 6, to the shaft and a low-value resistor 23 ($R_{DE,2}$, 1Ω), which can be used, for example, as the grounding resistor 11, to ground 10, a fuse 25 being arranged in parallel with the high-value resistor 22, and a measuring resistor 24 (0.1Ω) being arranged, for example, between ground and the low-value resistor 23. For diagnosis purposes, the shaft voltage between the high-value resistor and the contact device and the ground connection and the shaft current can then be tapped off via the measuring resistor.

The second grounding module 9 may be a unit as is described in the abovementioned EP 0 271 678 A1.

However, one critical feature in connection with the two grounding modules 8 and 9 is that they each have a grounding resistor 11 and 12, respectively, which makes it possible to determine the voltage measured across this resistor 11 or 12, whose resistance value is known, and the current flowing out to ground 10.

In the present case, an additional unit 13 in the form of a measurement and evaluation module is now provided. This measurement and evaluation module 13 on the one hand taps off the voltages occurring across the resistors 11 and 12 and measures them, as is indicated by the references 14 and 16.

In addition, the measurement and evaluation module 13 has a current source 21 (FIG. 2) which makes possible a well defined or known test current which is injected into the shaft 1 and allows the method to be carried out quantitatively. A typical DC test current has a value of 20 to 40 mA, for example of approximately 30 mA. The measurement and evaluation module 13 may also have hardware and software which makes possible deeper analysis. Furthermore, the measurement and evaluation module 13 may be part of one of the two grounding modules 8 or 9. The measurement and evaluation module 13 also has a connection to ground 10.

Figure 2:
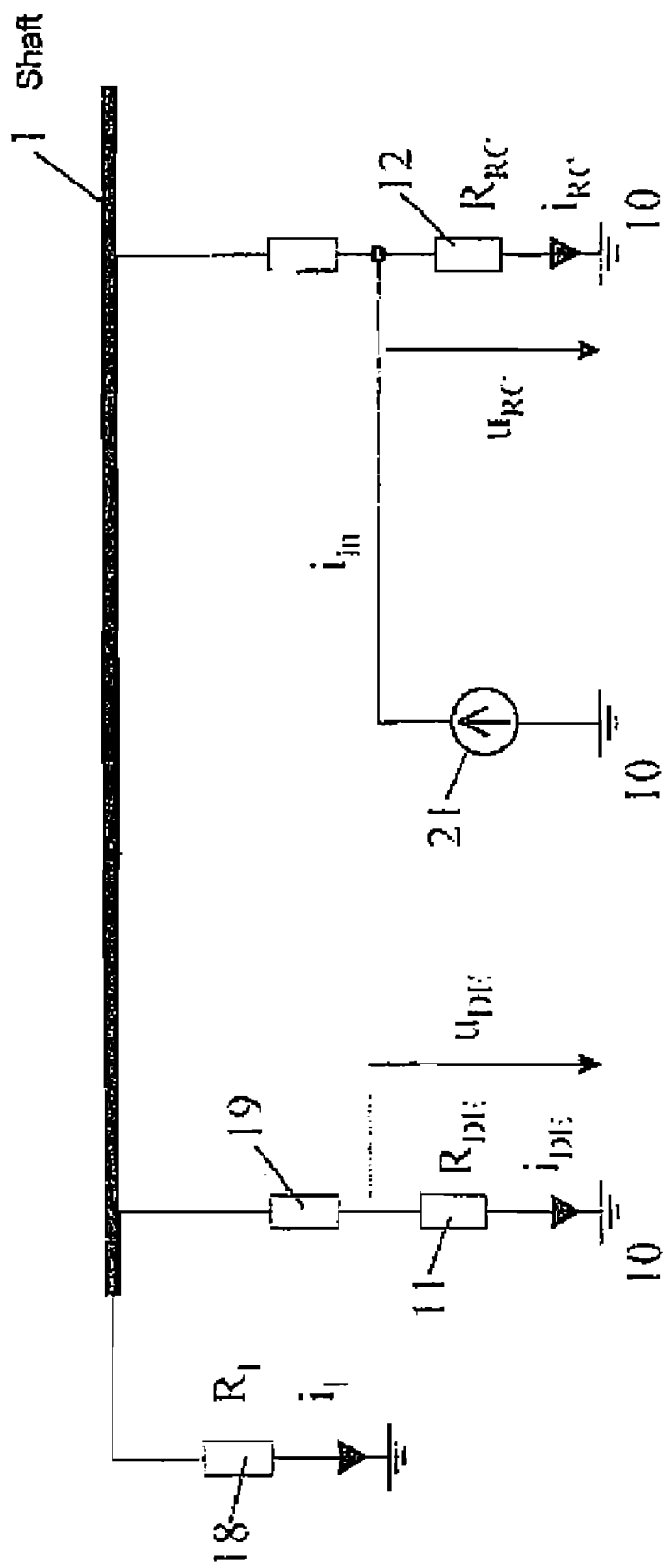
FIG. 2 shows a schematic illustration of the electrical connectivity of a rotating machine with grounding and measuring devices as shown in FIG. 1.

In order to be able to describe the method in more detail, FIG. 2 shows the electrical connectivity of an arrangement as shown in FIG. 1. A friction-point contact is in this case illustrated schematically by a friction-point resistor 18 having the resistance value $R_1$. A current $i_1$ flows to ground 10 via this fault in the insulation. Also shown is how a current $i_{DE}$ flows out to ground 10 via the first grounding module 8. This current $i_{DE}$ can be determined via the voltage which can be measured across the first grounding resistor 11 having the value $R_{DE}$ (for example a DC resistor having the value of 1 ohm). The first grounding module 8 has a brush contact resistance 19 to the shaft 1.

The second grounding resistor 12 having the value $R_{RC}$ (for example a DC resistor having the value of 470 ohms) is arranged in the second grounding module 9, and a current $i_{RC}$ flows to ground 10. This current can be determined as a result of the known value of $R_{RC}$ via the voltage $u_{RC}$ applied across the resistor 12.

It should be emphasized that the present method also functions with only one grounding point 8 or 9.

The novel method is now distinguished, inter alia, by an electrical test current $i_{in}$ having a known value being injected into the shaft 1 and, simultaneously therewith, all of the currents flowing out via the normal and intentional contacts (grounding brushes 6 and 7 or grounding modules 8 and 9), i.e. $i_{DE}$ and $i_{RC}$, being measured.

In the case of ideal shaft insulation, the total of all of the current values needs to result in the value 0, i.e. the total of the measured currents flowing in corresponds to the total of the measured currents flowing out. In the case of touching points, this balance is disturbed and the total of the currents flowing in is unequal to the total of the measured currents flowing out.

In order to carry out the method, the following measures are now taken:

Nonreactive resistors, i.e. the grounding resistors 11 and 12, having a known value are inserted in all of the intentional grounding connections, i.e. the two grounding modules 8 and 9, respectively, in order to create defined electrical conditions. This is used for estimating the "degree" of the touching point, i.e. of the average resistance $R_1$ over time of the touching point.

All of the currents flowing to ground via these intentional grounding contacts, i.e. $i_{DE}$ and $i_{RC}$, are measured.

In this case, advantageously only the DC components (DC) of the currents are measured. This is because the value of alternating currents additionally flowing in or flowing out (capacitive displacement currents) changes with time, is largely unknown and is normally difficult to measure. The DC component of currents additionally flowing in is unknown but is constant over the short term and medium term, and it primarily corresponds to the quantity of static electricity produced in the turbine. The DC components are determined by means of averaging over longer periods of time, for example over periods in the range from 1 to 10 s, or by filtering of the signals. This at the same time also eliminates very effectively the measurement inaccuracies owing to measurement noise.

A very advantageous measure is time differential measurement: in close time succession, the total $S_0$ of the currents $i_{DE}$ and $i_{RC}$ flowing out to ground without additional injected current $i_{in}$ is measured and, and shortly thereafter or else shortly before, the total $S_1$ of the currents flowing out with additional injected current $i_{in}$ The difference between the two current totals $S_1-S_0$ is then compared with the value of the injected current $i_{in}$ Given ideal insulation and measurement quality, both values are the same. This procedure serves the purpose of eliminating unknown, but temporally constant currents (such as the current caused by static charging of the turbine) from the balance.

The following statements can thus be made on the basis of the measured currents:

If $i_{in}=i_{DE}+i_{RC}$, there is ideal shaft insulation, i.e. there are no friction points ($R_1$ is infinitely high).

If $i_{in}=i_{RC}$, the fuse in the second grounding module 9 must have blown since the total injected current flows only via the second grounding module 9 to ground 10.

If $u_{RC} \gg u_{DE}$ or, in other words, $i_{RC} \gg i_{DE} \cdot (R_{DE}/R_{RC})$, the brush contacts on the grounding brushes 6, 7 must be poor.

If $u_{DE}/i_{DE}=R_{DE,1}$, i.e. in a specific case where $u_{DE}/i_{DE}=10$ $\Omega$, the fuse in the first grounding module must be defective.

In summary, it can be established that the above-described method or the device for carrying out this method is preferably distinguished by the following features:

The machine shaft 1 is electrically connected to ground 10 via-one or more grounding brushes 6, 7, nonreactive resistors, i.e. grounding resistors 11, 12, having a known value being inserted in all of these ground connections.

A measurement and evaluation module 13 measures all of the currents $i_{DE}$ and $i_{RC}$ which flow to ground 10 via the grounding modules 8, 9.

The measurement and evaluation module 13 adds up these currents, with the correct mathematical sign, i.e. currents which flow to ground 10 from the shaft 1 are evaluated as being positive, for example, and thus the total ground current $S_0$ ($i_{DE}+i_{RC}$) is determined which flows to ground 10 via these ground connections.

The measurement and evaluation module 13 which is also connected to ground 10 injects, at intermittent times, an additional test current $i_{in}$ having a known value into the shaft 1, the positive direction of the measurement and evaluation module 13 pointing towards the shaft 1, and at the same time in turn the total of the currents $S_1$ flowing out to ground being determined.

The measurement and evaluation module 13 compares the value of the total ground current $S_{0,0}$ without injection of test current with the value of the total ground current $S_{0,1}$, with injection of test current. The difference between the two values, i.e. the total ground current with injection of test current 17 minus the total ground current without injection of test current 17, is then compared with the value of the injected current $i_{in}$. If this difference in ground current differs from the value of the injected current, this is considered to be an indication of shaft touching and shaft friction.

The value of the difference, which must correspond to the current $i_1$ flowing out via the touching point, is then used to estimate the conductivity (or the resistance $R_1$) of the touching point, this taking place in accordance with the principles of current splitting via resistors.

What is claimed is:

1. A method for indicating a fault on a machine having a rotating shaft, the method comprising:
   providing at least one predetermined ground connection to the shaft;
   injecting a test current into the shaft for detection purposes;
   determining a grounding state of the shaft using a characteristic of an electrical flow to ground through the at least one ground connection during operation of the machine; and
   detecting at least one touching point on the shaft based on a value of the test current and the grounding state;
   indicating the fault upon the detection of the at least one touching point.

2. The method as recited in claim 1, wherein the characteristic includes a current.

3. The method as recited in claim 1, wherein the at least one predetermined ground connection is formed using at least one grounding module electrically connected to the shaft and having a grounding resistor, and wherein the grounding state is determined by measuring a voltage to ground across the grounding resistor.

4. The method as recited in claim 1, wherein a current of the electrical flow is evaluated as being positive.

5. The method as recited in claim 1, wherein the test current is injected into the shaft using the at least one ground connection.

6. The method as recited in claim 5, wherein the at least one ground connection includes at least one of a grounding brush and a sliding contact forming an electrical contact with the shaft.

7. The method as recited in claim 5, wherein the at least one grounding connection is formed by a grounding module and the test current is applied to the shaft at least indirectly using the grounding module.

8. The method as recited in claim 1, further comprising performing a comparison of the value of the test current with a difference between a first total ground current flowing to ground via the at least one ground connection including the test current and a second total ground current flowing to ground via the at least one ground connection without the test current.

9. The method as recited in claim 8, further comprising determining a conductivity of the touching point from the comparison.

10. The method as recited in claim 1, wherein the characteristic includes evaluating only a DC component of the electrical flow.

11. The method as recited in claim 10, further comprising one of averaging over time and filtering a total ground current flowing to ground via the at least one ground connection.

12. The method as recited in claim 1, wherein the at least one ground connection is formed using at least one grounding module in contact with ground and in contact with the shaft via at least one grounding brush.

13. A device for detecting a touching point on a machine having a rotating shaft, the device comprising:

at least one grounding module having a grounding brush forming a contact with the shaft and at least one grounding resistor; and a unit having an at least indirect contact to the shaft, the unit configured to inject a defined test current into the shaft and to tap off a voltage across the at least one grounding resistor, wherein the unit is configured to measure and/or evaluate the touching point based on a value of the test current and of a characteristic of a flow of electricity to ground via the at least one grounding resistor.

14. The device as recited in claim 13, wherein the at least indirect contact to the shaft is formed via the grounding module.

15. The device as recited in claim 13, wherein the unit and the at least one of the grounding modules form a single part.

* * * * *